United States Patent
Chang et al.

(10) Patent No.: US 11,532,655 B2
(45) Date of Patent: Dec. 20, 2022

(54) IMAGE SENSING DEVICE AND IMAGE-SENSING SYSTEM

(71) Applicant: Silicon Optronics, Inc., Hsinchu (TW)

(72) Inventors: Yen-Chen Chang, Hsinchu (TW); Bo-Ray Lee, Hsinchu (TW)

(73) Assignee: SILICON OPTRONICS, INC., Hsinchu (TW)

(*) Notice: Subject to any disclaimer, the term of this patent is extended or adjusted under 35 U.S.C. 154(b) by 219 days.

(21) Appl. No.: 16/874,062

(22) Filed: May 14, 2020

(65) Prior Publication Data
US 2021/0028212 A1 Jan. 28, 2021

(30) Foreign Application Priority Data
Jul. 24, 2019 (TW) .................................. 108126117

(51) Int. Cl.
*H01L 27/146* (2006.01)
(52) U.S. Cl.
CPC .. *H01L 27/14621* (2013.01); *H01L 27/14607* (2013.01); *H01L 27/14627* (2013.01); *H01L 27/14645* (2013.01)
(58) Field of Classification Search
CPC ......... H01L 27/14607; H01L 27/14636; H01L 27/14
See application file for complete search history.

(56) References Cited

U.S. PATENT DOCUMENTS

| | | | |
|---|---|---|---|
| 2003/0103150 A1 | 6/2003 | Catrysse | |
| 2007/0096087 A1 | 5/2007 | Catrysse | |
| 2014/0078359 A1* | 3/2014 | Lenchenkov | H01L 27/14621 257/432 |
| 2015/0264287 A1* | 9/2015 | Shimotsusa | H01L 27/14685 348/294 |
| 2016/0380016 A1 | 12/2016 | Kusaka | |
| 2017/0138866 A1* | 5/2017 | Huang | G01N 21/9501 |
| 2017/0278826 A1* | 9/2017 | Sugizaki | G02B 5/204 |
| 2018/0122852 A1* | 5/2018 | Nishimura | H01L 27/14636 |
| 2019/0157319 A1* | 5/2019 | Chiang | H01L 27/1461 |
| 2019/0189664 A1* | 6/2019 | Benahmed | G01N 33/4833 |
| 2019/0196108 A1 | 6/2019 | Cai | |
| 2019/0204226 A1* | 7/2019 | Fung | H01L 27/14621 |
| 2019/0206920 A1* | 7/2019 | Roch | H01L 27/14645 |
| 2021/0091135 A1* | 3/2021 | Yokogawa | H01L 27/14634 |

* cited by examiner

*Primary Examiner* — Wasiul Haider
(74) *Attorney, Agent, or Firm* — Muncy, Geissler, Olds & Lowe, P.C.

(57) ABSTRACT

An image-sensing device is provided. The image-sensing device includes a substrate, a light-sensing element, a first dielectric layer, a light-guiding structure, and a patterned conductive layer. The light-sensing element is disposed in the substrate. The first dielectric layer is disposed on the first side of the substrate. The light-guiding structure is disposed in the first dielectric layer. The patterned conductive layer is disposed between the light-sensing element and the light-guiding structure. In addition, the patterned conductive layer includes a subwavelength structure. An image-sensing system including the above image-sensing device is also provided.

19 Claims, 6 Drawing Sheets

IMAGE SENSING DEVICE AND IMAGE-SENSING SYSTEM

CROSS REFERENCE TO RELATED APPLICATIONS

This application claims priority of Taiwan Patent Application No. 108126117, filed on Jul. 24, 2019, the entirety of which is incorporated by reference herein.

BACKGROUND

Technical Field

The present disclosure relates to an image-sensing device and an image-sensing system including the above image-sensing device, and in particular it relates to an image-sensing device including a complementary metal-oxide-semiconductor (CMOS) structure.

Description of the Related Art

An image sensor is a semiconductor device that converts light images into electrical signals. Image sensors can generally be classified as either charge-coupled devices (CCD) or complementary metal-oxide-semiconductor (CMOS) image sensors. Among these image sensors, complementary metal-oxide-semiconductor image sensors include a photodiode for detecting incident light and converting it into an electrical signal, and a logic circuit for transmitting and processing the electrical signal.

In addition to being generally used only for sensing images, more and more image sensors have been used for various types of detection tasks, such as biomedical detection. Specifically, many characteristics of the test object can be detected or determined by the light excited by the test object after being illuminated by an external light source.

Although existing image sensors have been substantially adequate for their intended purposes, they have not been entirely satisfactory in all respects. For example, most image sensors still have problems such as cross-talk or low signal-to-noise ratio (SNR).

Therefore, the development of a structural design that can further improve the performance of an image-sensing device is still one of the goals that the industry is currently aiming at.

SUMMARY

In accordance with some embodiments of the present disclosure, an image-sensing device is provided. The image-sensing device includes a substrate, a light-sensing element, a first dielectric layer, a light-guiding structure and a patterned conductive layer. The light-sensing element is disposed in the substrate. The first dielectric layer is disposed on the first side of the substrate. The light-guiding structure is disposed in the first dielectric layer. The patterned conductive layer is disposed between the light-sensing element and the light-guiding structure. In addition, the patterned conductive layer includes a subwavelength structure.

In accordance with some embodiments of the present disclosure, an image-sensing system is provided. The image-sensing system includes an image-sensing device and a light source disposed on the image-sensing device. The image-sensing device includes a substrate, a light-sensing element, a first dielectric layer, a light-guiding structure and a patterned conductive layer. The light-sensing element is disposed in the substrate. The first dielectric layer is disposed on the first side of the substrate. The light-guiding structure is disposed in the first dielectric layer. The patterned conductive layer is disposed between the light-sensing element and the light-guiding structure. In addition, the patterned conductive layer includes a subwavelength structure.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The structure of the image-sensing device and the image-sensing system of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that the descriptions of the exemplary embodiments are intended to be read in connection with the accompanying drawings, which are to be considered part of the entire written description. The drawings are not drawn to scale. In fact, the size of the element may be arbitrarily enlarged or reduced in order to clearly express the features of the present disclosure.

In addition, it should be understood that, although the terms first, second, third etc. may be used herein to describe various elements, components, or portions, these elements, components, or portions should not be limited by these terms. These terms are only used to distinguish one element, component, or portion from another element, component, or portion. Thus, a first element, component, or portion discussed below could be termed a second element, component, or portion without departing from the teachings of the present disclosure.

The terms "about" and "substantially" typically mean +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially". Furthermore, the phrase "in a range between a first value and a second value" or "in a range from a first value to a second value" indicates that the range includes the first value, the second value, and other values between them.

In some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

It should be understood that when an element or layer is referred to as being "on" or "connected to" another element or layer, the element or layer can be directly on or connected to another element or layer, or there may be intervening elements or layers between the elements or layers. On the other hand, when an element or layer is referred to as being "directly on" or "directly connected to" another element or layer, there is no intervening element existing between the elements or layers.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the provided image-sensing device includes a patterned conductive layer having a subwavelength structure, which may improve the filtering effect of light of a specific range of wavelength or frequency according to need and may improve the signal-to-noise ratio of the image-sensing device.

Figure 1:
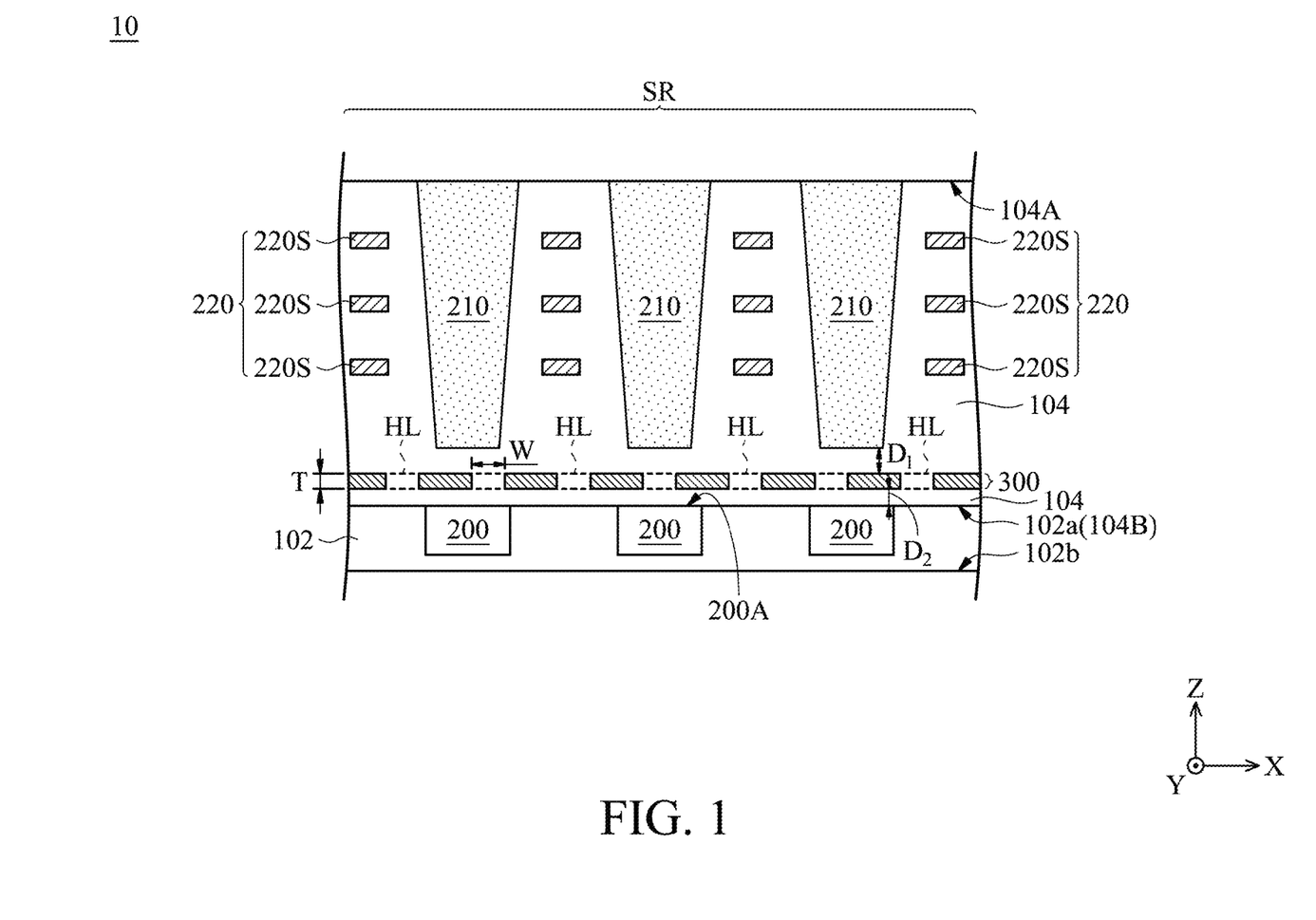
FIG. 1 is a cross-sectional diagram of an image-sensing device in accordance with some embodiments of the present disclosure.

Refer to FIG. 1, which is a cross-sectional diagram of an image-sensing device 10 in accordance with some embodiments of the present disclosure. It should be understood that additional features may be added to the image-sensing device 10 described below in accordance with some embodiments. In accordance with some embodiments, some of the features described below may be replaced or omitted.

As shown in FIG. 1, in accordance with some embodiments, the image-sensing device 10 may be a front side illumination (FSI) image-sensing device.

As shown in FIG. 1, the image-sensing device 10 may include a substrate 102. The substrate 102 may have a first side 102a and a second side 102b, and the second side 102b is opposite the first side 102a. In addition, the image-sensing device 10 may include a light-sensing element 200, and the light-sensing element 200 may be disposed in the substrate 102. In some embodiments, the top surface 200A of the light-sensing element 200 may be substantially aligned with the first side 102a of the substrate 102. That is, the light-sensing element 200 may be not buried in the substrate 102. However, in some other embodiments, the light-sensing element 200 may be buried in the substrate 102.

In accordance with some embodiments, the substrate 102 may be formed of an elemental semiconductor material. For example, in some embodiments, the material of the substrate 102 may include single crystal, polycrystalline, or amorphous silicon (Si) or germanium (Ge), or a combination thereof. In accordance with some embodiments, the substrate 102 may be formed of a compound semiconductor material. For example, in some embodiments, the material of the substrate 102 may include silicon carbide (SiC), gallium arsenide (GaAs), gallium phosphide (GaP), indium phosphide (InP), indium arsenide (InAs), or a combination thereof. In addition, in accordance with some embodiments, the substrate 102 may be formed of an alloy semiconductor material. For example, in some embodiments, the material of the substrate 102 may include silicon germanium (SiGe), gallium aluminum arsenide (AlGaAs), indium gallium arsenide (GaInAs), indium gallium phosphide (GaInP), gallium arsenide phosphide (GaAsP), or a combination thereof.

In accordance with some embodiments, the light-sensing element 200 may include a photodiode, but it is not limited thereto. In some embodiments, the light-sensing element 200 may receive the light reflected by the light-guiding structure 210 and convert it into an electrical signal. Specifically, in accordance with some embodiments, the photodiode may include a source and a drain of a metal-oxide-semiconductor (MOS) transistor (not illustrated), and the source and the drain may transmit current to other components such as other metal-oxide-semiconductor transistors.

In addition, in some embodiments, the light-sensing element 200 may include a transfer gate, a reset gate, a source-follow gate, a row-select gate, or a combination thereof. Furthermore, the light-sensing element 200 may be further coupled to an external device to transmit digital signals to the external device, such as a signal processor.

Referring to FIG. 1, the image-sensing device 10 may include a first dielectric layer 104, and the first dielectric layer 104 may be disposed on the first side 102a of the substrate 102. In some embodiments, the first dielectric layer 104 may cover the top surface 200A of the light-sensing element 200. In addition, in some embodiments, a sensing area SR of the image-sensing device 10 may be located on the top portion of the first dielectric layer 104, e.g., located on the top surface 104A of the first dielectric layer 104. In some embodiments, according to the needs of actual application, the top surface 104A of the first dielectric layer 104 may have a light-blocking effect.

In some embodiments, the material of the first dielectric layer 104 may include silicon oxide, silicon nitride, silicon oxynitride, high-k dielectric material, other suitable dielectric materials, or a combination thereof. In some embodiments, the high-k dielectric material may include a metal oxide, a metal nitride, a metal silicide, a metal aluminate, a zirconium silicate, a zirconium aluminate, or a combination thereof.

In some embodiments, a physical vapor deposition (PVD) process, a chemical vapor deposition (CVD) process, a coating process, other suitable processes, or a combination thereof may be used to form the first dielectric layer 104. The physical vapor deposition process may include, for example, a sputtering process, an evaporation process, or a pulsed laser deposition process. The chemical vapor deposition process may include, for example, a low pressure chemical vapor deposition (LPCVD) process, a low-temperature chemical vapor deposition (LTCVD) process, a rapid thermal chemical vapor deposition (RTCVD) process, a plasma enhanced chemical vapor deposition (PECVD) process, or an atomic layer deposition (ALD) process.

In addition, as shown in FIG. 1, the image-sensing device 10 may include a light-guiding structure 210, and the light-guiding structure 210 may be disposed in the first dielectric layer 104. The light-guiding structure 210 may extend from the top surface 104A of the first dielectric layer 104 toward the substrate 102, while not penetrating the first dielectric layer 104. In some embodiments, the light-guiding structure 210 may have a columnar structure, but the present disclosure is not limited thereto.

Specifically, the light-guiding structure 210 may guide the light generated in the sensing area SR to the light-sensing element 200 to achieve a light-concentrating effect. Moreover, in this embodiment, the light-guiding structure 210 may also reduce light interference from other elements (for example, an interconnect structure 220) that are located in the first dielectric layer 104, and therefore the loss of light may be reduced.

Furthermore, the light-guiding structure 210 may include a material having a high refractive index. Specifically, the refractive index of the light-guiding structure 210 may be greater than the refractive index of the first dielectric layer 104. In some embodiments, the light-guiding structure 210 may include a material having a refractive index greater than 1.5. In some embodiments, the light-guiding structure 210 may include a material having a refractive index in a range from 1.5 to 2.0, for example, the refractive index may be 1.6, 1.7, 1.8, or 1.9.

More specifically, in some embodiments, the light-guiding structure 210 may include a matrix and high refractive index particles dispersed in the matrix. In some embodiments, the matrix may include an organic material, an inorganic material, or a combination thereof. In some embodiments, the organic material may include polymethylmethacrylate (PMMA), polycarbonate (PC), polystyrene (PS), and polyethylene terephthalate (PET), other suitable materials, or a combination thereof. In some embodiments, the inorganic material may include optical glass, optical ceramic, or a combination thereof. In some embodiments, the high refractive index particles may include titanium dioxide ($TiO_2$), niobium-doped titanium oxide (TNO), zinc oxide (ZnO), zirconium dioxide ($ZrO_2$), or a combination thereof.

In addition, in accordance with some embodiments, the light-guiding structure 210 may also include a material having a filtering effect to filter light of a specific wavelength.

In some embodiments, a physical vapor deposition (PVD) process, a chemical vapor deposition (CVD) process, a coating process, other suitable processes, or a combination thereof may be used to form the light-guiding structure 210.

In addition, in some embodiments, a patterning process may be used to form the light-guiding structure 210. In some embodiments, the patterning process may include a photolithography process and an etching process. The photolithography process may include, but is not limited to, photoresist coating (for example, spin coating), soft baking, hard baking, mask alignment, exposure, post-exposure baking, photoresist development, cleaning, and drying. The etching process may include a dry etching process or a wet etching process, but it is not limited thereto.

Still referring to FIG. 1, the image-sensing device 10 may include a patterned conductive layer 300. As shown in FIG. 1, the patterned conductive layer 300 may be disposed between the light-sensing element 200 and the light-guiding structure 210, and the patterned conductive layer 300 may include a subwavelength structure. In other words, in some embodiments, the patterned conductive layer 300 may include a grating structure. In accordance with some embodiments, the patterned conductive layer 300 may be a subwavelength structure.

In some embodiments, the patterned conductive layer 300 may be disposed between the light-guiding structure 210 and the first side 102a of the substrate 102 (also referred to as the bottom surface 104B of the first dielectric layer 104). As shown in FIG. 1, in some embodiments, in the normal direction of the substrate 102 (e.g., the Z direction shown in the figure), the patterned conductive layer 300 may overlap the light-guiding structure 210.

Furthermore, in some embodiments, the patterned conductive layer 300 may include a plurality of hollowed-out regions HL. In some embodiments, the first dielectric layer 104 may fill the hollowed-out regions HL. In some other embodiments, the hollowed-out regions HL of the patterned conductive layer 300 may not be filled with any material, i.e. the hollowed-out regions HL may include air.

In accordance with some embodiments, the hollowed-out regions HL of the patterned conductive layer 300 may include a material with a low refractive index, for example, a material with a refractive index lower than that of the light-guiding structure 210. Specifically, in some embodiments, the hollowed-out regions HL may include a material having a refractive index of less than 1.5.

In some embodiments, the patterned conductive layer 300 (non-hollowed-out regions) may be formed of a material having high conductivity, such as a metallic material. In some embodiments, the material of the patterned conductive layer 300 may include copper (Cu), aluminum (Al), gold (Au), silver (Ag), titanium (Ti), tungsten (W), molybdenum (Mo), Nickel (Ni), copper alloy, aluminum alloy, gold alloy, silver alloy, titanium alloy, tungsten alloy, molybdenum alloy, nickel alloy, or a combination thereof.

In some embodiments, a physical vapor deposition (PVD) process, a chemical vapor deposition (CVD) process, a coating process, other suitable processes, or a combination thereof may be used to form the patterned conductive layer 300.

In addition, in some embodiments, a patterning process may be used to form the patterned conductive layer 300. In some embodiments, the patterning process may include a photolithography process and an etching process. The photolithography process may include, but is not limited to, photoresist coating (for example, spin coating), soft baking, hard baking, mask alignment, exposure, post-exposure baking, photoresist development, cleaning, and drying. The etching process may include a dry etching process or a wet etching process, but it is not limited thereto.

In addition, as shown in FIG. 1, the patterned conductive layer 300 may not be in contact with the light-guiding structure 210. In some embodiments, the patterned conductive layer 300 and the light-guiding structure 210 may be separated by a first distance $D_1$. In some embodiments, the first distance $D_1$ may be in a range from 0.05 micrometers (μm) to 0.5 μm, e.g., 0.1 μm, 0.2 μm, 0.3 μm, or 0.4 μm. Furthermore, in some embodiments, the patterned conductive layer 300 and the substrate 102 (the bottom surface 104B of the first dielectric layer 104) may be separated by a second distance $D_2$. In some embodiments, the second distance $D_2$ may be in a range from 0.05 μm to 0.5 μm, e.g., 0.1 μm, 0.2 μm, 0.3 μm, or 0.4 μm.

It should be noted that if the first distance $D_1$ between the patterned conductive layer 300 and the light-guiding structure 210 is too small (e.g., less than 0.05 μm), the conditions for the local plasma resonance frequency may not be provided. On the other hand, if the first distance $D_1$ between the patterned conductive layer 300 and the light-guiding structure 210 is too large (e.g., greater than 0.5 μm), the conditions for the local plasma resonance frequency also may not be provided or the emission of excessive electromagnetic waves may occur.

Furthermore, if the second distance $D_2$ between the patterned conductive layer 300 and the substrate 102 is too small (e.g., less than 0.05 μm), the conditions for the local plasma resonance frequency may not be provided. On the other hand, if the second distance $D_2$ between the patterned conductive layer 300 and the substrate 102 is too large (e.g., greater than 0.5 μm), the conditions for the local plasma resonance frequency also may not be provided or the emission of excessive electromagnetic waves may occur.

In addition, the patterned conductive layer 300 may have a thickness T. In some embodiments, the thickness T of the patterned conductive layer 300 may be in a range from 0.05 μm to 1 μm, e.g., 0.1 μm, 0.2 μm, 0.3 μm, 0.4 μm, 0.5 μm, 0.6 μm, 0.7 μm, 0.8 μm, or 0.9 μm. It should be noted that if the thickness T of the patterned conductive layer 300 is too small or too large, the light-filtering effect of the patterned conductive layer 300 may be reduced. However, it should be understood that, as different materials may be used for the patterned conductive layer 300, the range of the thickness T may be adjusted accordingly.

In particular, in accordance with some embodiments of the present disclosure, the patterned conductive layer 300 may enhance the resonance effect of light of a specific frequency through the surface plasmon resonance mechanism. That is, the filtering effect for light with a specific wavelength or frequency may be enhanced, and the signal-to-noise ratio between different wavebands may be improved.

Moreover, in accordance with different embodiments, the shape, dimension such as width W, arrangement, or periodicity (periodicity of grating) etc. of the hollowed-out regions HL of the patterned conductive layer 300 may be appropriately adjusted according to need so that the surface plasmon resonance effect of the patterned conductive layer 300 may be enhanced. The specific aspect of the patterned conductive layer 300 will be described in detail in the following context.

In addition, in some embodiments, the image-sensing device 10 may further include an interconnect structure 220. As shown in FIG. 1, in some embodiments, the interconnect structure 220 may be disposed in the first dielectric layer 104. Furthermore, in this embodiment, the patterned conductive layer 300 may be disposed between the interconnect structure 220 and the substrate 102.

In some embodiments, the interconnect structure 220 may be disposed between the light-guiding structures 210. In some embodiments, the projection (not illustrated) of the interconnect structure 220 on the substrate 102 and the projection (not illustrated) of the light-guiding structure 210 on the substrate 102 may not overlap. In some embodiments, the interconnect structure 220 may overlap the patterned conductive layer 300 in the normal direction of the substrate 102 (e.g., the Z direction shown in the figure).

As shown in FIG. 1, in some embodiments, the interconnect structure 220 may include a plurality of conductive layers 220S to provide electrical connections for the internal components of the image-sensing device 10. It should be understood that although three layers of conductive layers 220S are exemplarily illustrated in the figures, the present disclosure is not limited thereto. In accordance with different embodiments, according to need, suitable amount and structure of the conductive layer 220S may be disposed to form the interconnect structure 220.

In some embodiments, the interconnect structure 220 may include a metallic conductive material, a transparent conductive material, or a combination thereof. The metallic conductive material may include copper (Cu), aluminum (Al), gold (Au), silver (Ag), titanium (Ti), tungsten (W), molybdenum (Mo), nickel (Ni), copper alloy, aluminum alloy, gold alloy, silver alloy, titanium alloy, tungsten alloy, molybdenum alloy, nickel alloy, or a combination thereof. The transparent conductive material may include a transparent conductive oxide (TCO). For example, the transparent conductive oxide may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), or a combination thereof.

In some embodiments, a physical vapor deposition (PVD) process, a chemical vapor deposition (CVD) process, a coating process, other suitable processes, or a combination thereof may be used to form the interconnect structure 220.

In addition, in some embodiments, a patterning process may be used to form the interconnect structure 220. In some embodiments, the patterning process may include a photolithography process and an etching process. The photolithography process may include, but is not limited to, photoresist coating (for example, spin coating), soft baking, hard baking, mask alignment, exposure, post-exposure baking, photoresist development, cleaning, and drying. The etching process may include a dry etching process or a wet etching process, but it is not limited thereto.

Figure 2:
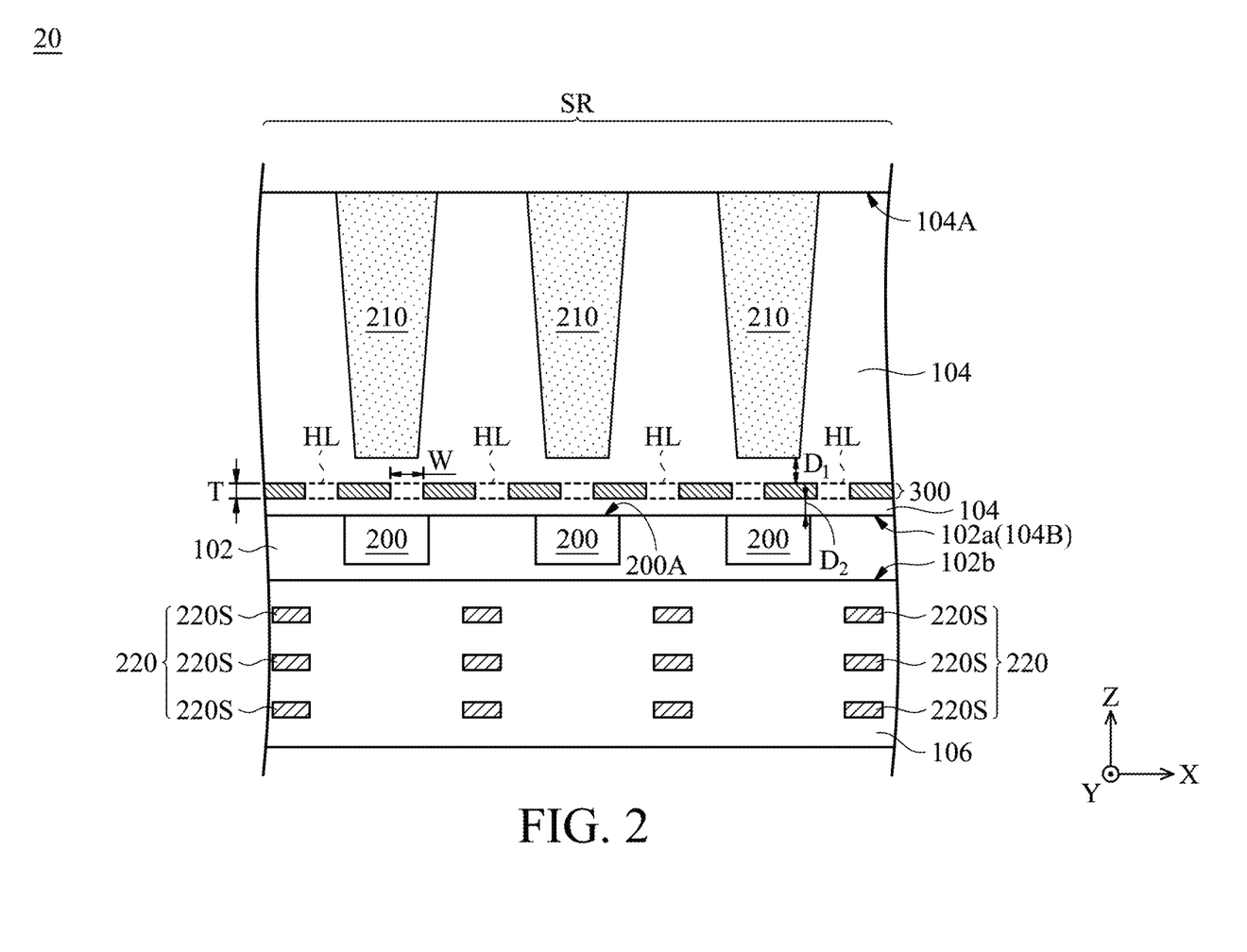
FIG. 2 is a cross-sectional diagram of an image-sensing device in accordance with some embodiments of the present disclosure.

Next, refer to FIG. 2, which is a cross-sectional diagram of an image-sensing device 20 in accordance with some other embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

As shown in FIG. 2, in accordance with some embodiments, the image-sensing device 20 may be a back side illumination (BSI) image-sensing device.

As shown in FIG. 2, the image-sensing device 20 may include a substrate 102 having a first side 102a and a second side 102b, and the second side 102b is opposite the first side 102a. In addition, the image-sensing device 20 may include a light-sensing element 200, and the light-sensing element 200 may be disposed in the substrate 102. In some embodiments, the top surface 200A of the light-sensing element 200 may be substantially aligned with the first side 102a of the substrate 102. That is, the light-sensing element 200 may be not buried in the substrate 102. However, in some other embodiments, the light-sensing element 200 may be buried in the substrate 102.

In accordance with some embodiments, the light-sensing element 200 may include a photodiode, but it is not limited thereto. In some embodiments, the light-sensing element 200 may receive the light reflected by the light-guiding structure 210 and convert it into an electrical signal. Specifically, in accordance with some embodiments, the photodiode may include a source and a drain of a metal-oxide-semiconductor (MOS) transistor (not illustrated), and the source and the drain may transmit current to other components such as other metal-oxide-semiconductor transistors.

In addition, in some embodiments, the light-sensing element 200 may include a transfer gate, a reset gate, a source-follow gate, a row-select gate, or a combination thereof. Furthermore, the light-sensing element 200 may be further coupled to an external device to transmit digital signals to the external device, such as a signal processor.

As shown in FIG. 2, the image-sensing device 20 may include a first dielectric layer 104, and the first dielectric layer 104 may be disposed on the first side 102a of the substrate 102. In some embodiments, the first dielectric layer 104 may cover the top surface 200A of the light-sensing element 200. In addition, in some embodiments, a sensing area SR of the image-sensing device 20 may be located on the top portion of the first dielectric layer 104, e.g., located on the top surface 104A of the first dielectric layer 104.

Furthermore, as shown in FIG. 2, the image-sensing device 20 may include a second dielectric layer 106, and the second dielectric layer 106 may be disposed on the second side 102b of the substrate 102. That is, in this embodiment, the substrate 102 may be disposed between the first dielectric layer 104 and the second dielectric layer 106.

In some embodiments, the material of the second dielectric layer 106 may include silicon oxide, silicon nitride, silicon oxynitride, high-k dielectric material, other suitable dielectric materials, or a combination thereof. In some embodiments, the high-k dielectric material may include a metal oxide, a metal nitride, a metal silicide, a metal aluminate, a zirconium silicate, a zirconium aluminate, or a combination thereof. Moreover, the material of the first dielectric layer 104 may be the same as or different from the material of the second dielectric layer 106.

In some embodiments, a physical vapor deposition (PVD) process, a chemical vapor deposition (CVD) process, a coating process, other suitable processes, or a combination thereof may be used to form the second dielectric layer 106.

In addition, the image-sensing device 20 may include a light-guiding structure 210, and the light-guiding structure 210 may be disposed in the first dielectric layer 104. The light-guiding structure 210 may extend from the top surface 104A of the first dielectric layer 104 toward the substrate 102, while not penetrating the first dielectric layer 104. In some embodiments, the light-guiding structure 210 may have a columnar structure, but the present disclosure is not limited thereto.

Specifically, the light-guiding structure 210 may guide the light generated in the sensing area SR to the light-sensing element 200 to achieve a light-concentrating effect and reduce the loss of light.

Furthermore, the light-guiding structure 210 may include a material having a high refractive index. Specifically, the refractive index of the light-guiding structure 210 may be greater than the refractive index of the first dielectric layer 104. In some embodiments, the light-guiding structure 210 may include a material having a refractive index greater than 1.5. In some embodiments, the light-guiding structure 210 may include a material having a refractive index in a range from 1.5 to 2.0, for example, the refractive index may be 1.6, 1.7, 1.8, or 1.9.

In addition, in accordance with some embodiments, the light-guiding structure 210 may also include a material having a filtering effect to filter light of a specific wavelength.

In addition, the image-sensing device 20 may include a patterned conductive layer 300. As shown in FIG. 2, the patterned conductive layer 300 may be disposed between the light-sensing element 200 and the light-guiding structure 210, and the patterned conductive layer 300 may include a subwavelength structure. In other words, in some embodiments, the patterned conductive layer 300 may include a grating structure. In accordance with some embodiments, the patterned conductive layer 300 may be a subwavelength structure. In addition, in this embodiment, the patterned conductive layer 300 may be disposed between the first dielectric layer 104 and the second dielectric layer 106.

In some embodiments, the patterned conductive layer 300 may be disposed between the light-guiding structure 210 and the first side 102a of the substrate 102 (also referred to as the bottom surface 104B of the first dielectric layer 104). As shown in FIG. 2, in some embodiments, in the normal direction of the substrate 102 (e.g., the Z direction shown in the figure), the patterned conductive layer 300 may overlap the light-guiding structure 210.

Furthermore, in some embodiments, the patterned conductive layer 300 may include a plurality of hollowed-out regions HL. In some embodiments, the first dielectric layer 104 may fill the hollowed-out regions HL. In some other embodiments, the hollowed-out regions HL of the patterned conductive layer 300 may not be filled with any material, i.e. the hollowed-out regions HL may include air.

In accordance with some embodiments, the hollowed-out regions HL of the patterned conductive layer 300 may include a material with a low refractive index, for example, a material with a refractive index lower than that of the light-guiding structure 210. Specifically, in some embodiments, the hollowed-out regions HL may include a material having a refractive index of less than 1.5.

In addition, as shown in FIG. 2, the patterned conductive layer 300 may not be in contact with the light-guiding structure 210. In this embodiment, the patterned conductive layer 300 and the light-guiding structure 210 may be separated by a first distance $D_1$. In some embodiments, the first distance $D_1$ may be in a range from 0.05 micrometers (μm) to 0.5 μm, e.g., 0.1 μm, 0.2 μm, 0.3 μm, or 0.4 μm. Furthermore, in some embodiments, the patterned conductive layer 300 and the substrate 102 (the bottom surface 104B of the first dielectric layer 104) may be separated by a second distance $D_2$. In some embodiments, the second distance $D_2$ may be in a range from 0.05 μm to 0.5 μm, e.g., 0.1 μm, 0.2 μm, 0.3 μm, or 0.4 μm.

It should be noted that if the first distance $D_1$ between the patterned conductive layer 300 and the light-guiding structure 210 is too small (e.g., less than 0.05 μm), the conditions for the local plasma resonance frequency may not be provided. On the other hand, if the first distance $D_1$ between the patterned conductive layer 300 and the light-guiding structure 210 is too large (e.g., greater than 0.5 μm), the conditions for the local plasma resonance frequency also may not be provided or the emission of excessive electromagnetic waves may occur.

Furthermore, if the second distance $D_2$ between the patterned conductive layer 300 and the substrate 102 is too small (e.g., less than 0.05 μm), the required conditions for the local plasma resonance frequency may not be provided. On the other hand, if the second distance $D_2$ between the patterned conductive layer 300 and the substrate 102 is too large (e.g., greater than 0.5 μm), the required conditions for the local plasma resonance frequency also may not be provided or the emission of excessive electromagnetic waves may occur.

In addition, the patterned conductive layer 300 may have a thickness T. In some embodiments, the thickness T of the patterned conductive layer 300 may be in a range from 0.05 μm to 1 μm, e.g., 0.1 μm, 0.2 μm, 0.3 μm, 0.4 μm, 0.5 μm, 0.6 μm, 0.7 μm, 0.8 μm, or 0.9 μm. It should be noted that if the thickness T of the patterned conductive layer 300 is too small or too large, the light-filtering effect of the patterned conductive layer 300 may be reduced. However, it should be understood that, as different materials may be used for the patterned conductive layer 300, the range of the thickness T may be adjusted accordingly.

In accordance with some embodiments of the present disclosure, the patterned conductive layer 300 may enhance the resonance effect of light of a specific frequency through the surface plasmon resonance mechanism. That is, the filtering effect for light with a specific wavelength or frequency may be enhanced, and the signal-to-noise ratio between different wavebands may be improved.

Moreover, in accordance with different embodiments, the shape, dimension such as width W, arrangement, or periodicity (periodicity of grating) etc. of the hollowed-out regions HL of the patterned conductive layer 300 may be appropriately adjusted according to need so that the surface plasmon resonance effect of the patterned conductive layer 300 may be enhanced. The specific aspect of the patterned conductive layer 300 will be described in detail in the following context.

In addition, in some embodiments, the image-sensing device 20 may further include an interconnect structure 220. As shown in FIG. 2, in some embodiments, the interconnect structure 220 may be disposed in the second dielectric layer 106 and below the light-sensing element 200. Furthermore, in this embodiment, the patterned conductive layer 300 may be disposed between the interconnect structure 220 and the first dielectric layer 104.

In this embodiment, the projection (not illustrated) of the interconnect structure 220 on the substrate 102 and the projection (not illustrated) of the light-guiding structure 210 on the substrate 102 may not overlap. In some embodiments, the interconnect structure 220 may overlap the patterned conductive layer 300 in the normal direction of the substrate 102 (e.g., the Z direction shown in the figure).

As shown in FIG. 2, in some embodiments, the interconnect structure 220 may include a plurality of conductive layers 220S to provide electrical connections for the internal components of the image-sensing device 20. It should be understood that although three layers of conductive layers 220S are exemplarily illustrated in the figures, the present disclosure is not limited thereto. In accordance with different embodiments, according to need, suitable amount and structure of the conductive layer 220S may be disposed to form the interconnect structure 220.

In this embodiment, since the interconnect structure 220 is disposed in the second dielectric layer 106 and below the light-sensing element 200, the risk of light being interfered by the interconnect structure 220 may be further reduced. Therefore, the sensitivity of the image-sensing device 20 may be improved.

In addition, it should be understood that in accordance with some embodiments, the image-sensing device 10 and the image-sensing device 20 may further include a microlens, a color filter and a passivation layer on the first dielectric layer 104 according to actual needs, although they are not illustrated in the figures.

Figure 3:
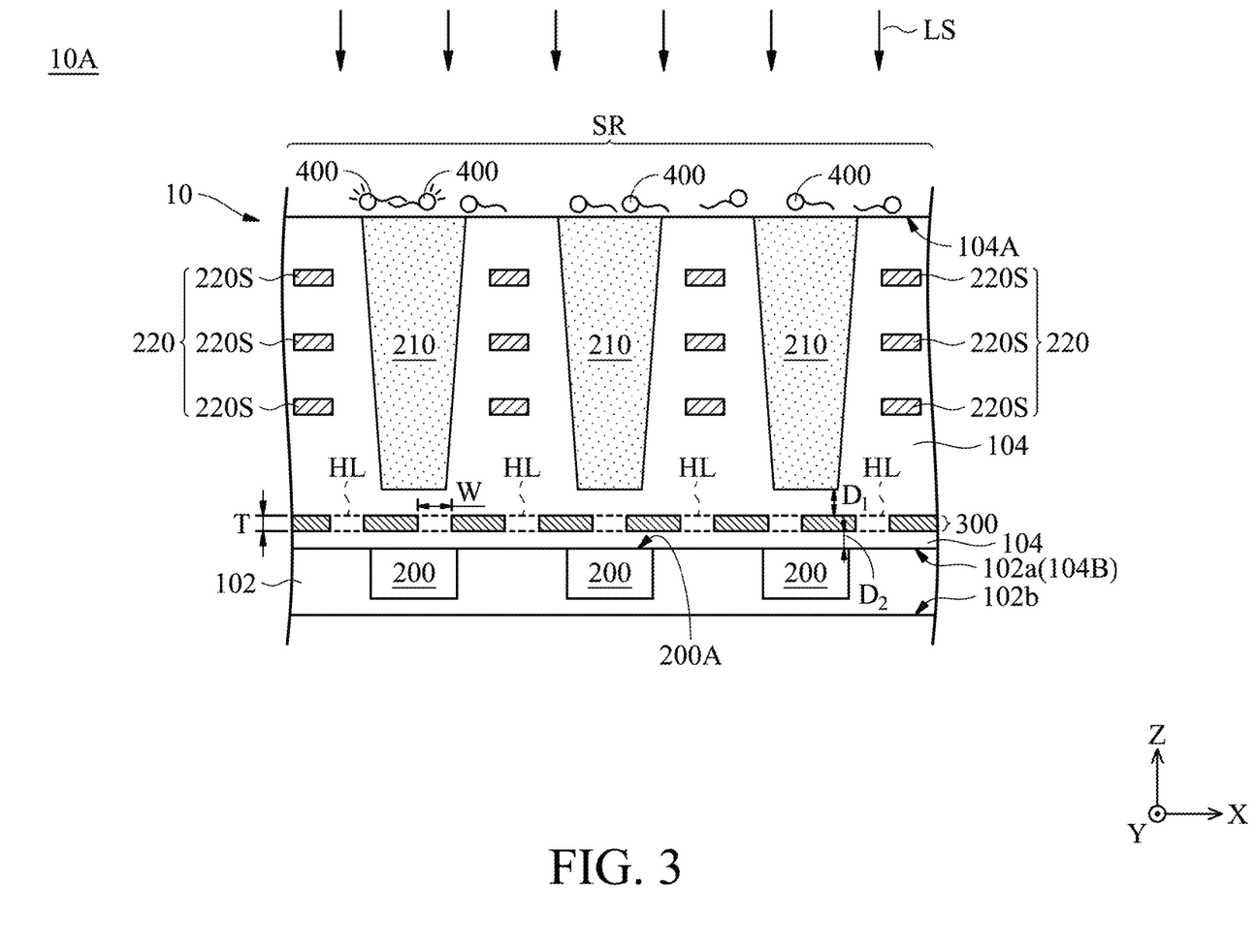
FIG. 3 is a cross-sectional diagram of an image-sensing system in accordance with some embodiments of the present disclosure.

Next, refer to FIG. 3, which is a cross-sectional diagram of an image-sensing system 10A in accordance with some embodiments of the present disclosure. As shown in FIG. 3, the image-sensing system 10A may include the image-sensing device 10 as described above and a light source LS, and the light source LS may be disposed on the image-sensing device 10.

In some embodiments, the light source LS may be disposed on the first dielectric layer 104 and illuminate the sensing area SR. Furthermore, in accordance with some embodiments, the sensing area SR may accommodate a test object 400. In some embodiments, the light source LS may provide excitation light and the excitation light may make the test object 400 in the sensing area SR emit light of a specific wavelength or frequency. The light of a specific wavelength or frequency then may be transmitted to the light-sensing element 200 through the light-guiding structure 210, and therefore various properties of the test object 400 may be detected or determined.

Specifically, in accordance with different embodiments, the light source LS may provide excitation light of a suitable range of wavelength or frequency according to the properties of the tag of the test object 400. For example, the light source LS may excite the tag to emit fluorescence or luminescence, but the present disclosure is not limited thereto. In some embodiments, the light source LS may include a polarized light, an unpolarized light, or a combination thereof.

In some embodiments, the test object 400 may include a biological molecule, a chemical molecule, or a combination thereof. For example, in some embodiments, the test object 400 may include deoxyribonucleic acid (DNA), ribonucleic acid (RNA), proteins, cells, other organic and inorganic small molecules, or a combination thereof, but the present disclosure is not limited thereto.

In accordance with some embodiments, the test object 400 may include a fluorescent tag, and the light source LS may include polarized light. The polarized light source LS may further increase the sensitivity of the detection of fluorescence.

Figure 4:
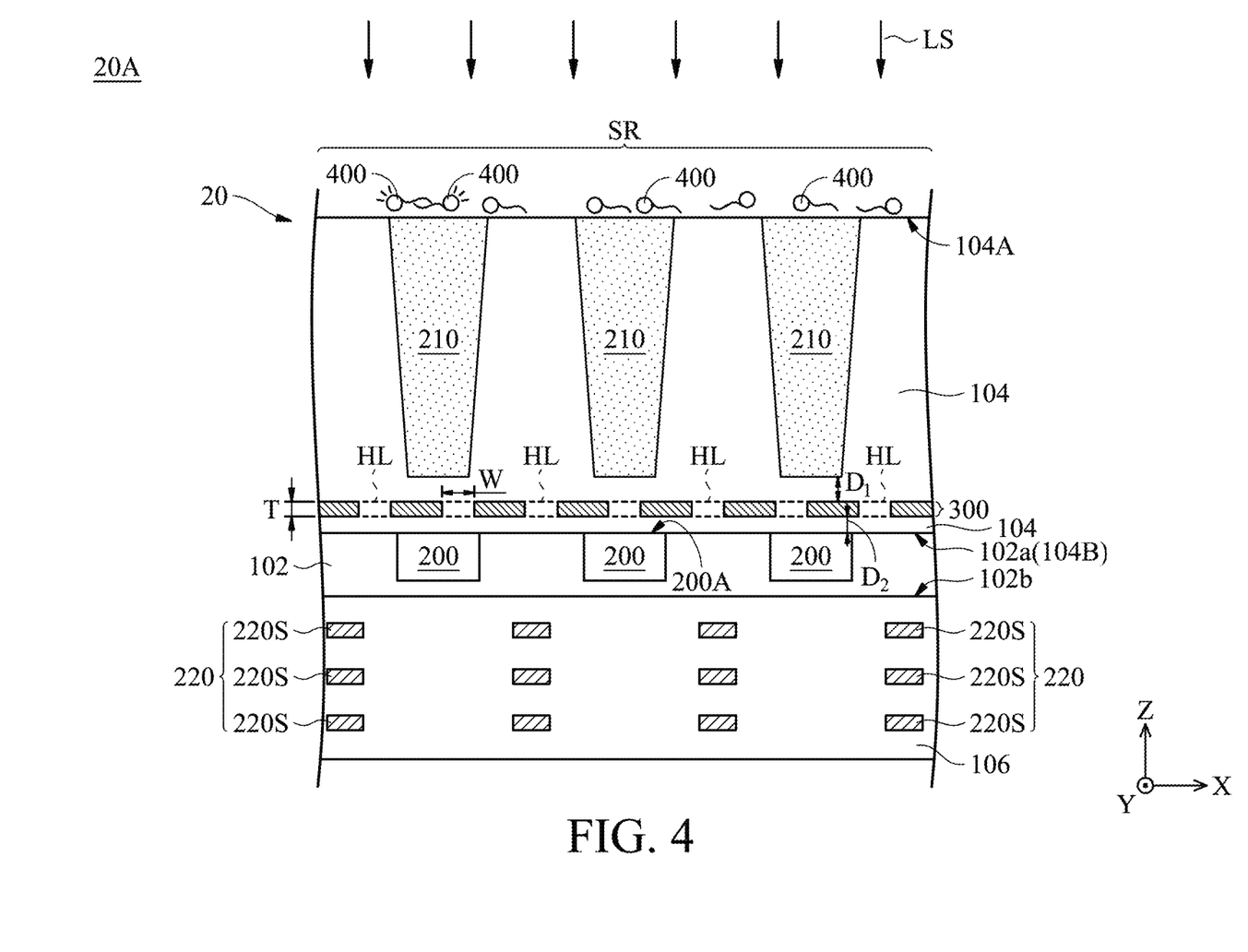
FIG. 4 is a cross-sectional diagram of an image-sensing system in accordance with some embodiments of the present disclosure.

Next, refer to FIG. 4, which is a cross-sectional diagram of an image-sensing system 20A in accordance with some embodiments of the present disclosure. As shown in FIG. 4, the image-sensing system 20A may include the image-sensing device 20 as described above and a light source LS, and the light source LS may be disposed on the image-sensing device 20.

In some embodiments, the light source LS may be disposed on the first dielectric layer 104 and illuminate the sensing area SR. Furthermore, in accordance with some embodiments, the sensing area SR may accommodate a test object 400. In some embodiments, the light source LS may provide excitation light and the excitation light may make the test object 400 in the sensing area SR emit light of a specific wavelength or frequency. The light of a specific wavelength or frequency then may be transmitted to the light-sensing element 200 through the light-guiding structure 210, and therefore various properties of the test object 400 may be detected or determined.

Specifically, in accordance with different embodiments, the light source LS may provide excitation light of a suitable range of wavelength or frequency according to the properties of the tag of the test object 400. For example, the light source LS may excite the tag to emit fluorescence or luminescence, but the present disclosure is not limited thereto. In some embodiments, the light source LS may include a polarized light, an unpolarized light, or a combination thereof.

In some embodiments, the test object 400 may include a biological molecule, a chemical molecule, or a combination thereof. For example, in some embodiments, the test object 400 may include deoxyribonucleic acid (DNA), ribonucleic acid (RNA), proteins, cells, other organic and inorganic small molecules, or a combination thereof, but the present disclosure is not limited thereto.

In accordance with some embodiments, the test object 400 may include a fluorescent tag, and the light source LS may include polarized light. The polarized light source LS may further increase the sensitivity of the detection of fluorescence.

Next, refer to FIGS. 5A to 5H, which are top-view diagrams of the conductive patterned layer 300 in accordance with some embodiments of the present disclosure. As shown in FIGS. 5A to 5H, the hollowed-out regions HL of the patterned conductive layer 300 may have a symmetrical shape, an asymmetric shape, an irregular shape, or a combination thereof.

Figure 5A:
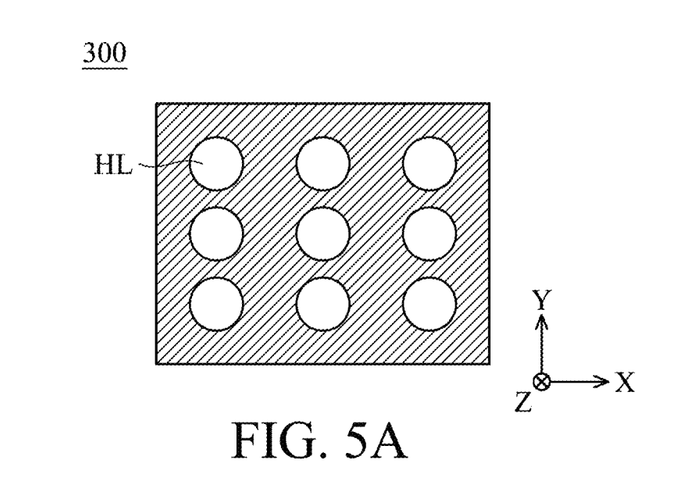
FIGS. 5A to 5H are top-view diagrams of conductive patterned layers of image-sensing devices in accordance with some embodiments of the present disclosure.
Figure 5B:
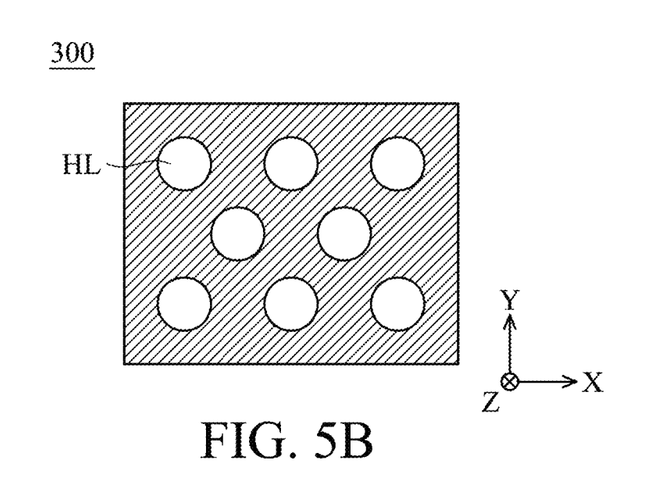
Figure 5C:
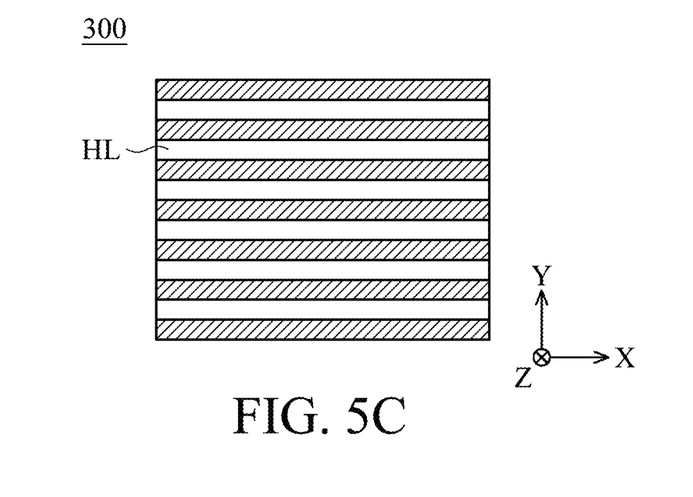
Figure 5D:
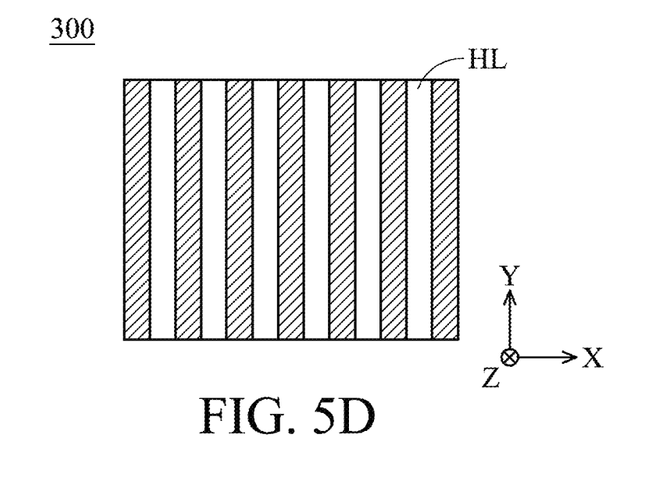

Specifically, as shown in FIG. 5A and FIG. 5B, in some embodiments, the patterned conductive layer 300 may have a circular hollowed-out region HL. As shown in FIG. 5C and FIG. 5D, in some embodiments, the patterned conductive layer 300 may have a strip-shaped or rectangular hollowed-out region HL. It should be understood that although the strip-shaped hollowed-out regions HL that extend along the X direction or the Y direction are illustrated in the figures, the present disclosure is not limited thereto. In accordance with some other embodiments, the hollowed-out region HL may also extend along other suitable directions, or may extend along multiple different directions.

Figure 5E:
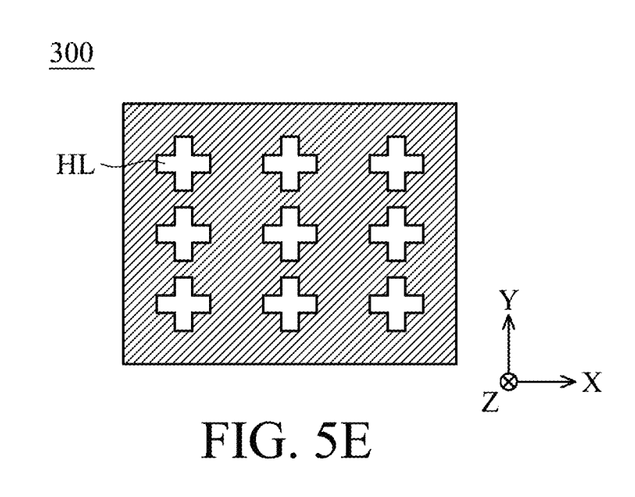
Figure 5F:
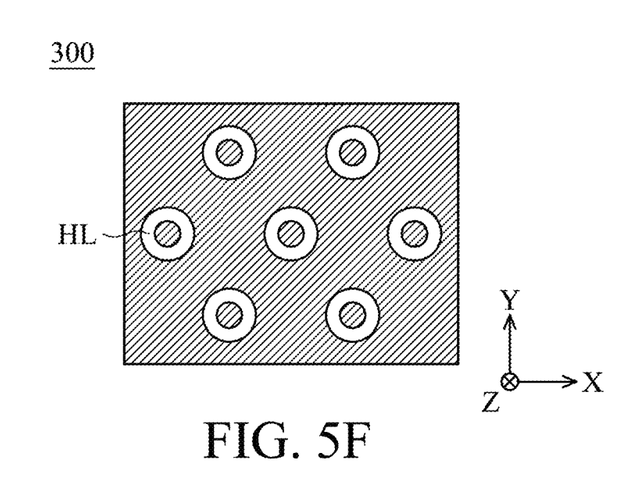
Figure 5G:
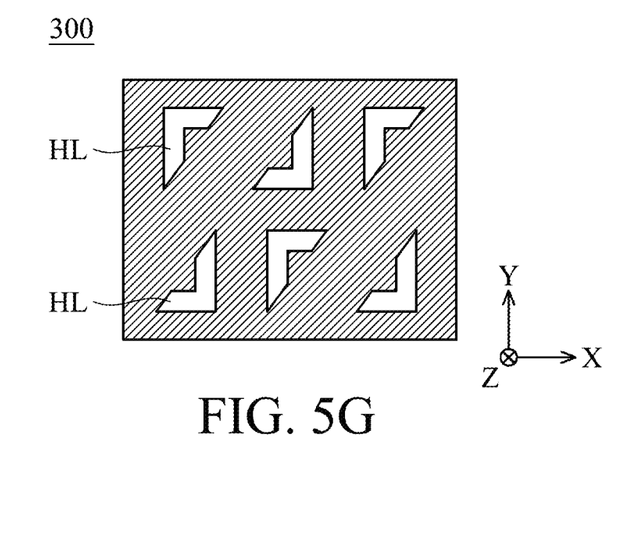
Figure 5H:
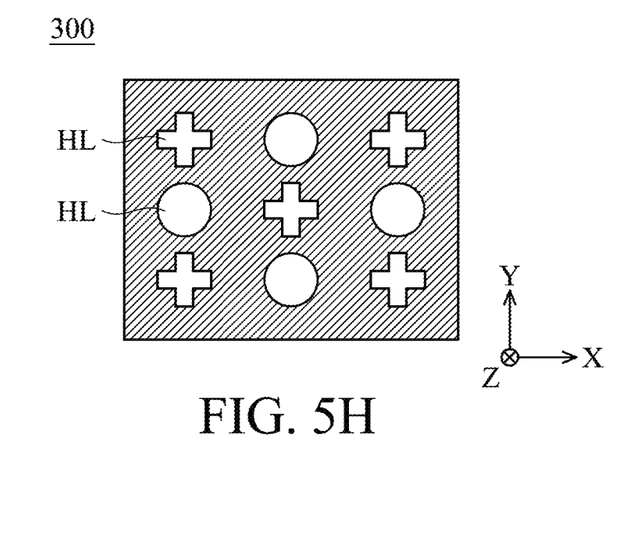

Furthermore, as shown in FIG. 5E, in some embodiments, the patterned conductive layer 300 may have a cross-shaped hollowed-out region HL. As shown in FIG. 5F, in some embodiments, the patterned conductive layer 300 may have a ring-shaped hollowed-out region HL. As shown in FIG. 5G, in some embodiments, the patterned conductive layer 300 may have an asymmetric shaped hollowed-out region HL. As shown in FIG. 5H, in some embodiments, the patterned conductive layer 300 may include the hollowed-out regions HL having the shapes of the combination of two or more.

In addition, the hollowed-out regions HL of the patterned conductive layer 300 may be arranged in a regular or irregular manner, and the frequency or periodicity of the hollowed-out regions HL may also be adjusted according to need.

As described above, in accordance with different embodiments, the shape, dimension, arrangement, or periodicity etc. of the hollowed-out regions HL of the patterned conductive layer 300 may be appropriately adjusted according to need so that the surface plasmon resonance effect of the patterned conductive layer 300 to the light of a specific wavelength or frequency may be enhanced and thus the filtering effect may be increased.

Specifically, in accordance with some embodiments, a finite-difference-time-domain (FDTD) software is used to perform optical simulation on the patterned conductive layer 300 (e.g., the embodiment shown in FIG. 5E). The simulation results show that the signal-to-noise ratio (log value of (sensitivity 650 nm/sensitivity 530 nm)) of the patterned conductive layer 300 in the embodiments of the present disclosure can be effectively improved by at least about 1.2 times to about 2 times compared with the unpatterned conductive layer.

In addition, in accordance with some other embodiments, the finite-difference-time-domain software is used to perform optical simulation on the image-sensing device 10 including the patterned conductive layer 300 (e.g., the embodiment shown in FIG. 5C and FIG. 5D) and the image-sensing device not including the patterned conductive layer 300 (which is the same as the image-sensing device 10 except that it does not have the patterned conductive layer 300). The simulation results show that the image-sensing device 10 having the patterned conductive layer 300 in the embodiments of the present disclosure has a better extinction ratio (a ratio of the light transmittance in the vertical direction to the light transmittance in the horizontal direction) compared with the image-sensing device without the patterned conductive layer 300.

In accordance with some embodiments, the extinction ratio of the image-sensing device 10 may reach about 300 or more, about 500 or more, or about 1000 or more. Accordingly, it can be known that the image-sensing device 10 provided in the embodiments of the present disclosure also has a favorable filtering effect for polarized light. In addition, for light having a specific polarization direction, the patterned conductive layer 300 can have a better light blocking ability than the unpatterned conductive layer.

To summarize the above, in accordance with some embodiments of the present disclosure, the provided image-sensing device includes the patterned conductive layer having a subwavelength structure, which may improve the filtering effect of light of a specific range of wavelength or frequency according to need and may improve the signal-to-noise ratio of the image-sensing device.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The scope of protection of present disclosure is subject to the definition of the scope of the appended claims.

What is claimed is:
1. An image-sensing device, comprising:
a substrate;
a light-sensing element disposed in the substrate;
a first dielectric layer disposed on a first side of the substrate;
a light-guiding structure disposed in the first dielectric layer; and a patterned conductive layer disposed between the light-sensing element and the light-guiding structure, wherein the patterned conductive layer comprises a grating structure, wherein the patterned conductive layer is separated from the light-guiding structure by a first distance, the first distance is between a top surface of the patterned conductive layer and a bottom surface of the light-guiding structure, and the first distance is in a range from 0.05 micrometers to 0.5 micrometers.

2. The image-sensing device as claimed in claim 1, wherein the patterned conductive layer comprises a plurality of hollowed-out regions, and the first dielectric layer fills the hollowed-out regions.

3. The image-sensing device as claimed in claim 1, wherein the patterned conductive layer comprises a plurality of hollowed-out regions, and the hollowed-out regions comprise air.

4. The image-sensing device as claimed in claim 1, wherein the patterned conductive layer is separated from the substrate by a second distance, and the second distance is in a range from 0.05 micrometers to 0.5 micrometers.

5. The image-sensing device as claimed in claim 1, wherein a material of the patterned conductive layer comprises copper, aluminum, gold, silver, titanium, tungsten, molybdenum, nickel, copper alloy, aluminum alloy, gold alloy, silver alloy, titanium alloy, tungsten alloy, molybdenum alloy, nickel alloy, or a combination thereof.

6. The image-sensing device as claimed in claim 1, wherein the light-guiding structure comprises a material having a refractive index greater than 1.5.

7. The image-sensing device as claimed in claim 6, wherein the light-guiding structure comprises the material having the refractive index in a range from 1.5 to 2.0.

8. The image-sensing device as claimed in claim 1, wherein the patterned conductive layer overlaps the light-guiding structure in a normal direction of the substrate.

9. The image-sensing device as claimed in claim 1, further comprising an interconnect structure disposed in the first dielectric layer.

10. The image-sensing device as claimed in claim 9, wherein the patterned conductive layer is disposed between the interconnect structure and the substrate.

11. The image-sensing device as claimed in claim 1, further comprising a second dielectric layer and an interconnect structure, wherein the second dielectric layer is disposed on a second side of the substrate, the second side is opposite the first side, and the interconnect structure is disposed in the second dielectric layer.

12. An image-sensing system, comprising:
an image-sensing device, comprising:
a substrate;
a light-sensing element disposed in the substrate;
a first dielectric layer disposed on a first side of the substrate;
a light-guiding structure disposed in the first dielectric layer; and
a patterned conductive layer disposed between the light-sensing element and the light-guiding structure, wherein the patterned conductive layer comprises a grating structure, wherein the patterned conductive layer is separated from the light-guiding structure by a first distance, the first distance is between a top surface of the patterned conductive layer and a bottom surface of the light-guiding structure, and the first distance is in a range from 0.05 micrometers to 0.5 micrometers; and
a light source disposed on the image-sensing device.

13. The image-sensing system as claimed in claim 12, wherein the patterned conductive layer comprises a plurality of hollowed-out regions, and the first dielectric layer fills the hollowed-out regions.

14. The image-sensing system as claimed in claim 12, wherein the patterned conductive layer comprises a plurality of hollowed-out regions, and the hollowed-out regions comprise air.

15. The image-sensing system as claimed in claim 12, wherein the patterned conductive layer overlaps the light-guiding structure in a normal direction of the substrate.

16. The image-sensing system as claimed in claim 12, wherein the light source comprises a polarized light, an unpolarized light, or a combination thereof.

17. The image-sensing system as claimed in claim 12, the image-sensing device further comprising a sensing area located on a top surface of the first dielectric layer.

18. The image-sensing system as claimed in claim 17, wherein the sensing area accommodates a test object.

19. The image-sensing system as claimed in claim 18, the test object comprising a biological molecule, a chemical molecule, or a combination thereof.

* * * * *